United States Patent [19]

Williams et al.

[11] 4,213,798

[45] Jul. 22, 1980

[54] TELLURIUM SCHOTTKY BARRIER CONTACT FOR AMORPHOUS SILICON SOLAR CELLS

[75] Inventors: Richard Williams, Princeton; Yehuda Arie, Cranbury, both of N.J.

[73] Assignee: RCA Corporation, New York, N.Y.

[21] Appl. No.: 33,967

[22] Filed: Apr. 27, 1979

[51] Int. Cl.² ............................................. H01L 31/06
[52] U.S. Cl. ........................... 136/89 SJ; 136/89 TF; 357/2; 357/15; 357/30; 427/74; 427/250
[58] Field of Search ...................... 136/89 SJ, 89 TF; 357/2, 15, 16, 30; 427/74, 250

[56] References Cited

U.S. PATENT DOCUMENTS

| | | | |
|---|---|---|---|
| 3,018,426 | 1/1962 | Ruppel | 357/61 |
| 3,483,038 | 12/1969 | Hui et al. | 136/89 |
| 3,622,712 | 11/1971 | Moore et al. | 179/100.41 K |
| 4,035,197 | 7/1977 | Raychaudhuri | 136/89 CD |
| 4,064,521 | 12/1977 | Carlson | 357/2 |
| 4,121,981 | 10/1978 | Ward et al. | 204/38 R |
| 4,142,195 | 2/1979 | Carlson et al. | 357/15 |

OTHER PUBLICATIONS

D. E. Carlson et al., "Solar Cells Using Schottky Barriers on Amorphoous Silicon", *Conf. Record, 12th IEEE Photovoltaic Specialists Conf.* (1976), pp. 893–895.

J. I. B. Wilson et al., "Schottky Barrier Photovoltaic Diodes on Doped Amorphous Silicon", *Proc. Int'l. Photovoltaic Solar Energy Conf.* (1977), pp. 223–230.

*Primary Examiner*—Aaron Weisstuch
*Attorney, Agent, or Firm*—Birgit E. Morris; A. Stephen Zavell

[57] ABSTRACT

A Schottky barrier amorphous silicon solar cell incorporates a tellurium layer as the Schottky barrier.

13 Claims, 1 Drawing Figure

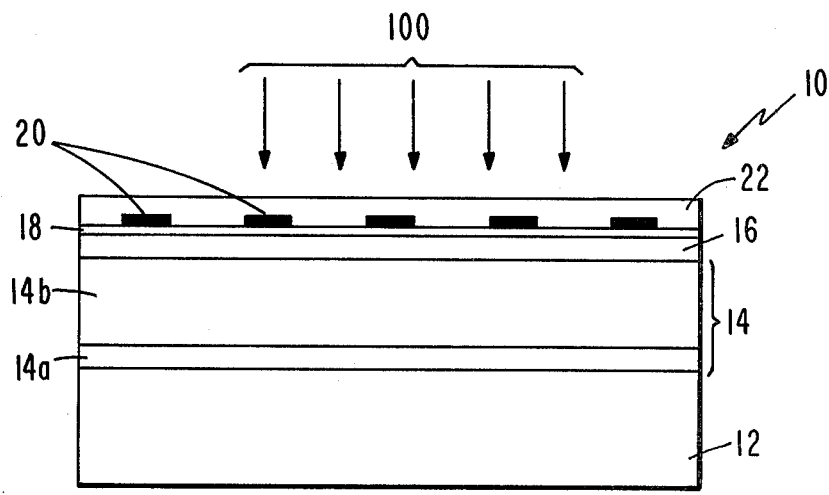

TELLURIUM SCHOTTKY BARRIER CONTACT FOR AMORPHOUS SILICON SOLAR CELLS

This invention relates to solar cells. More specifically, this invention relates to Schottky barrier solar cells.

BACKGROUND OF THE INVENTION

Photovoltaic devices, such as Schottky barrier solar cells, are capable of converting solar radiation into usable electrical energy. The energy conversion occurs as a result of what is well-known in the solar cell field as the photovoltaic effect. Solar radiation impinging on a solar cell comprising an electrically conductive substrate, a layer of semiconductor material ohmically contacting the substrate, and a Schottky barrier layer contact on the semiconductor, is absorbed by the semiconductor layer, generating electrons and holes. The electrons and holes are separated by a built-in electric field in the solar cell formed between the Schottky barrier layer and the active body of semiconductor material. The electrons, which are generated in the Schottky barrier layer flow toward the N-type semiconductor body where said electrons are collected. The separation of electrons and holes results in an electrical current.

A basic type of Schottky barrier solar cell is disclosed in U.S. Pat. No. 4,064,521, incorporated herein by reference. The Schottky barrier is formed between a high work function metal layer such as platinum and an intrinsic layer of hydrogenated amorphous silicon. The magnitude of the open circuit voltage generated by the solar cell is dependent, inter alia, upon the barrier height between the body of semiconductor material and the Schottky barrier metal. To increase the open circuit voltage it would be desirable to find a material which would increase barrier height. In addition, a standard hydrogenated amorphous silicon Schottky barrier solar cell requires an expensive electron-beam evaporator for the deposition of the metal layer. A simple evaporation of the metal layer would lower the cost and be more desirable.

SUMMARY OF THE INVENTION

An improved Schottky barrier solar cell comprises a layer of tellurium contacting a body of semiconductor material and forming a Schottky barrier thereto. The invention specifically embodies a method of increasing the open circuit voltage of a Schottky barrier hydrogenated amorphous silicon solar cell through the incorporation of a layer of tellurium as the Schottky barrier material.

BRIEF DESCRIPTION OF THE DRAWING

The FIGURE illustrates a Schottky barrier solar cell incorporating a thin tellurium layer as the Schottky barrier material contacting the body of semiconductor material.

DETAILED DESCRIPTION OF THE INVENTION

The invention will be more clearly illustrated by referring to the FIGURE which depicts a Schottky barrier solar cell designated as 10, hereinafter solar cell 10. Although the solar cell can be fabricated with other semiconductor materials, such as single crystal silicon, polycrystalline silicon, gallium arsenide, cadmium selenide, cadmium sulfide, and like materials, which will form a Schottky barrier with tellurium, the invention illustrated by the FIGURE will be described as having a semiconductor material of hydrogenated amorphous silicon. Solar radiation 100 impinging upon solar cell 10 is a reference point for the incident surface of each layer or region of the solar cell.

Solar cell 10 includes a substrate 12 of a material having good electrical conductivity properties and the ability to make an ohmic contact to the body 14 of hydrogenated amorphous silicon. Examples of suitable substrate materials are aluminum, chromium, stainless steel, niobium, tantalum, iron, molybdenum, titanium, indium tin oxide on glass wherein the indium tin oxide is the conductive material, and the like.

The body 14 of hydrogenated amorphous silicon has regions 14a and 14b of differing conductivity. The body 14 of hydrogenated amorphous silicon is fabricated by a glow discharge as taught in U.S. Pat. No. 4,064,521, U.S. Pat. No. 4,142,195, and application Ser. No. 727,659, filed Sept. 29, 1976; said patents and applications are incorporated herein by reference. The region 14a, contiguous to and deposited on the substrate 12, is doped N+-type. The device may be fabricated without region 14a but the N+-type region 14a assures an ohmic contact to the conducting substrate 12. The region 14a may have a thickness of up to about 1000 nanometers if the substrate 12 has a rough surface, although, preferably, the thickness is on the order of from about 10 to about 50 nanometers. The region 14b of intrinsic hydrogenated amorphous silicon is contiguous to region 14a. Intrinsic hydrogenated amorphous silicon, fabricated by a glow discharge without conductivity modifiers incorporated in the fabrication system, is slightly N-type. Region 14b has a thickness of from about 200 to about 1000 nanometers and preferably about 400 nanometers. The thickness of the region 14b should be adjusted so that it is approximately equal to the width of the space charge region generated by the solar cell during illumination at zero bias plus the hole diffusion length of the device.

The Schottky barrier layer 16 of tellurium is deposited upon the body 14. The tellurium layer is evaporated to a thickness of from about 5 nanometers to about 25 nanometers and preferably less than about 10 nanometers. Tellurium is a semiconductor material having a low bandgap of about 0.32 eV at room temperature, which makes the material function like a metal and not a heterojunction to the body of amorphous silicon 14. The low band gap of tellurium enables the fabrication of a film with a lower series resistance than a true semiconductor material such as cadmium telluride which has a bandgap of 1.4 eV, or silicon and gallium arsenide having bandgaps of 1.1 eV and 1.5 eV respectively. Although not apparently clear at the present time, the tellurium layer 16, having a work function which is comparable to the work function of platinum, provides a better contact to the body 14 and increases the barrier height with a resultant increase in the open circuit voltage of solar cell 10.

Optionally, a transparent metal or other transparent conductor layer 18 of materials such as platinum, gold, aluminum, indium, PtSiO$_2$ cermet, indium tin oxide, and like materials which form an ohmic contact to the tellurium layer and exhibit a low sheet resistance and which do not adversely react with tellurium, is evaporated onto the tellurium layer 16 by standard techniques known in the art, such as evaporation or electronbeam evaporation. Layer 18 has a thickness of from about 2 to about 20 nanometers. For hydrogenated amorphous silicon, the combination of layer 18 and layer 16 increases open circuit voltage over a standard platinum Schottky barrier solar cell.

A grid electrode 20 of a material having good electrical conductivity ohmically contacts layer 16, or layer 18 when it is included within solar cell structure 10. The grid electrode 20 occupies only a small area of the surface of solar cell 10, i.e., about 5 to about 10 percent, since solar radiation 100 impinging on a grid electrode 20 may be reflected away from the body 14. The function of the grid electrode 20 is to uniformly collect current from either layer 16 or layer 18. The grid electrode 20 assures a low series resistance from solar cell 10.

As the size of the solar cell decreases, the need for the grid electrode structure diminishes. With a small solar cell, a transparent conductive oxide layer 22, which may also double as an antireflection coating, having a sheet resistivity of less than about 10 ohms/square, is sufficient to withdraw the current generated during the operation of the solar cell 10. The transparent conductive oxide layer 22 functions as an antireflection coating and supplements the grid electrode 20. A transparent conductive oxide can be selected from the group consisting of tin oxide, indium-tin oxide, cadmium stannate, and like material.

The previously described solar cell is fabricated, among other ways, in accordance with the following procedure. The hydrogenated amorphous silicon body is fabricated by a glow discharge which involves the discharge of electricity through a gas at a relatively low pressure, i.e., about 5 Torr or less. The discharge power source can be either RF power, AC power, DC cathodic discharge, or DC proximity discharge. A DC proximity discharge is defined to mean a DC discharge where the substrate is located near or in the proximity of the cathode screen electrode. The N+-type region is fabricated by adding a suitable N-type conductivity modifier such as phosphorus, arsenic, antimony, bismuth, cesium, sodium, and the like, into the silicon and hydrogencontaining atmosphere during the deposition.

After the deposition of the body of hydrogenated amorphous silicon, the device may optionally be annealed in forming gas (80 percent nitrogen and 20 percent hydrogen), or an atmosphere of 90 percent nitrogen and 10 percent hydrogen for from several minutes to an hour at from about 150° C. to about 400° C. Shorter annealing times should be used as the temperature increases to preclude the outgasing of hydrogen from the body 14. The annealing procedure appears to remove defects created in the body 14 during the deposition process for certain films.

Although the preceeding description for the semiconductor material was illustrated with a description of hydrogenated amorphous silicon, the semiconductor body can be fabricated with other N-type semiconductors and by methods known in the art such as epitaxial deposition, Czochralski crystal growth, chemical vapor deposition or like methods. The skilled artisan would understand that the semiconductor body thicknesses will vary depending upon the fabrication technique and material utilized.

The tellurium layer is deposited on the body by heating tellurium in a resistive boat such as a boat of molybdenum coated with alumina, to a temperature of from about 500° C. to about 600° C. at a pressure of from about $10^{-4}$ to about $10^{-5}$ Torr. The substrate with the body of semiconductor material can be at ambient temperature or at an elevated temperature during the evaporation.

The grid electrode and other layers are fabricated by methods known in the art such as evaporation and like methods.

The invention will be further illustrated by the following Example, but it is to be understood that the invention is not meant to be limited solely to the details described therein. Modifications which would be obvious to one of ordinary skill in the solar cell art are contemplated to be within the scope of the invention.

EXAMPLE I

A stainless steel substrate having an N+-type region of hydrogenated amorphous silicon with a thickness of about 640 nanometers contiguous to said substrate and a region of intrinsic hydrogenated amorphous silicon having a thickness of about 440 nanometers contiguous to said N+-type region wherein the hydrogen content of the intrinsic region was about 30 atomic percent was placed in an evaporation apparatus. The pressure in the apparatus was reduced to about $1 \times 10^{-4}$ Torr, and a molybdenum boat coated with alumina containing tellurium was heated to about 300°–325° C. The substrate having the hydrogenated amorphous silicon layer thereon was at room temperature, i.e., about 20° C. A portion of the layer was covered to preclude the evaporation of tellurium thereon. Six dots of tellurium were evaporated on the uncovered portion of the hydrogenated amorphous silicon layer to a thickness of about 10 nanometers in about 10–15 seconds. Thereafter, platinum was electron-beam evaporated onto the tellurium dots and six platinum dots were electron-beam evaporated onto other portions of the layer which had previously been shielded from the tellurium evaporation with a Denton Model DEG-801 electron-beam evaporator. The thickness of the platinum was about 5–10 nanometers. Therefter, the twelve dots were illuminated and the open circuit voltage of each dot was measured. The average open circuit voltage of the six tellurium-platinum solar cells was about 670±13 millivolts. The average of the platinum only solar cells was about 613±4 millivolts. The short circuit currents for the 12 solar cells were about 3 mA/cm². The larger value of the open circuit voltage for the tellurium contacts increases the solar cell efficiency about 9.3 percent.

We claim:

1. In a Schottky barrier solar cell which comprises an electrically conductive substrate, a body of hydrogenated amorphous silicon having regions of differing conductivity, said body having opposed major surfaces wherein one of said major surfaces ohmically contacts said substrate, and a layer of material forming a Schottky barrier with said body contiguous to a major surface of said body opposite to said substrate, the improvement wherein the material which forms the Schottky barrier is a layer of tellurium.

2. The solar cell according to claim 1 wherein said tellurium layer has a thickness of from about 5 to about 25 nanometers.

3. The solar cell according to claim 1 wherein said body of hydrogenated amorphous silicon has two regions of differing conductivity.

4. The solar cell according to claim 3 wherein said body comprises a region of N+-type conductivity hydrogenated amorphous silicon which contacts said substrate and a region of intrinsic hydrogenated amorphous silicon which contacts said N+-type region and said tellurium layer.

5. The solar cell according to claim 4 wherein the tellurium layer has a thickness of from about 5 to about 25 nanometers.

6. The solar cell according to claim 1 wherein a metal or transparent conductor layer overlies said tellurium layer.

7. The solar cell according to claim 6 wherein said metal or transparent conductor layer is selected from the group consisting of platinum, aluminum, indium, gold, $PtSiO_2$, and indium tin oxide.

8. In a Schottky barrier hydrogenated amorphous silicon solar cell which comprises an electrically conductive substrate, a body of hydrogenated amorphous silicon ohmically contacting said substrate, and a material forming a Schottky barrier with said body of hydrogenated amorphous silicon, the improvement wherein the material which forms the Schottky barrier is tellurium.

9. The solar cell according to claim 8 wherein said tellurium is in the form of a layer from about 5 to about 25 nanometers thick.

10. The solar cell according to claim 9 wherein a transparent metal or transparent conductor layer overlies said layer of tellurium.

11. A method of increasing the open circuit voltage of a platinum Schottky barrier hydrogenated amorphous silicon solar cell which comprises an electrically conductive substrate, a body of hydrogenated amorphous silicon ohmically contacting said substrate, and a platinum Schottky barrier layer contacting said body of hydrogenated amorphous silicon, comprising interposing a layer of tellurium between said body of hydrogenated amorphous silicon and said platinum Schottky barrier metal layer.

12. The method according to claim 11 wherein said tellurium layer has a thickness of from about 5 to about 25 nanometers.

13. The method according to claim 12 wherein said tellurium is evaporated onto said body by heating the tellurium to a temperature of from about 500° to about 600° C. at a pressure of from about $10^{-4}$ to about $10^{-5}$ Torr.

* * * * *